(12) United States Patent
Kurosawa

(10) Patent No.: US 7,226,520 B2
(45) Date of Patent: Jun. 5, 2007

(54) METHOD FOR FORMING PATTERN AND METHOD FOR FORMING MULTILAYER WIRING STRUCTURE BY DROPLET DISCHARGE SYSTEM

(75) Inventor: Hirofumi Kurosawa, Tatsuno-machi (JP)

(73) Assignee: Seiko Epson Corporation (JP)

( * ) Notice: Subject to any disclaimer, the term of this patent is extended or adjusted under 35 U.S.C. 154(b) by 287 days.

(21) Appl. No.: 10/815,292

(22) Filed: Mar. 31, 2004

(65) Prior Publication Data
US 2004/0239730 A1 Dec. 2, 2004

(30) Foreign Application Priority Data
Apr. 1, 2003 (JP) ............... 2003-098255

(51) Int. Cl.
*B32B 37/00* (2006.01)
(52) U.S. Cl. ...................... 156/230; 156/256
(58) Field of Classification Search ............... 156/250, 156/256, 278, 230, 234, 238, 239, 240, 241; 438/22, 200, 715
See application file for complete search history.

(56) References Cited

U.S. PATENT DOCUMENTS 5,338,597 A * 8/1994 Kurabayashi et al. ...... 428/32.1
6,734,029 B2 * 5/2004 Furusawa ..................... 438/22
6,766,734 B2 * 7/2004 Geddes et al. ................ 101/33
2002/0151161 A1 * 10/2002 Furusawa ................... 438/597

FOREIGN PATENT DOCUMENTS

| JP | 57-92896 | 9/1982 |
|---|---|---|
| JP | 05-050741 | 3/1993 |
| JP | 10-173316 | 6/1998 |
| JP | 2000-332383 | 11/2000 |
| JP | 2002-134878 | 5/2002 |
| JP | 2002-164635 | 6/2002 |
| JP | 2002-324966 | 11/2002 |

OTHER PUBLICATIONS

Japanese Examination Result for Jap. Ser. No. 2003-098255 dated Jun. 29, 2006.
Japanese Examination Result dated Oct. 17, 2006.

* cited by examiner

*Primary Examiner*—James Sells
(74) *Attorney, Agent, or Firm*—John J. Penny, Jr.; George N. Chaclas; Edwards Angell Palmer & Dodge, LLP

(57) ABSTRACT

An adhesive tape constructed of a base material 11 and an adhesive layer 12 is used as a substrate 1. Droplets 2 formed of a liquid containing electrically conductive ultra-fine particles dispersed therein are disposed in a specified wiring pattern on the adhesive layer 12. The adhesive tape 1 is put into a hot-air oven 3 to dry the disperse medium from the droplets 2. Accordingly, a wiring layer 21 made of silver particles contained in the droplets 2 is formed on the adhesive layer 12 of the adhesive tape 1.

13 Claims, 9 Drawing Sheets

METHOD FOR FORMING PATTERN AND METHOD FOR FORMING MULTILAYER WIRING STRUCTURE BY DROPLET DISCHARGE SYSTEM

Japanese Patent Application No. 2003-98255 filed on Apr. 1, 2003, form which applicant claims priority, is hereby incorporated by reference in its entirety.

BACKGROUND OF THE INVENTION

1. Technical Field of the Invention

The present invention relates to a method for forming a pattern by a droplet discharge system.

2. Description of the Related Art

An example of a conventional method for forming a wiring pattern by a droplet discharge system (hereinafter, referred to as an inkjet system) is a method described in Japanese Unexamined Patent Application Publication No. 2002-164635. According to the method disclosed herein, in order to form an accurate wiring pattern, a lyophilic section and a liquid repellent section are formed into a specified pattern on a substrate surface with an organic molecule layer, thereby selectively dropping a liquid containing electrically conductive ultra-fine particles onto the lyophilic section.

The wiring-pattern forming technique by the inkjet system is required to reduce the width of the wire. To this end, the applicant has proposed a method for forming small droplets by dropping the liquid on a substrate surface processed to be liquid repellent (for example, refer to Japanese Patent Application No. 2002-089810, unpublished at the present time).

An example of the method for making a liquid-repellent substrate surface is a method of forming a self-assembled layer on the substrate surface with, for example, fluoroalkyl-silane. The fluoroalkyl group is thus disposed on the surface of the self-assembled layer to make the substrate surface liquid repellent.

Specifically, for example, 10-g of hexadecafluoro-1,1,2,2-tetrahydrodecyltriethoxysilane and a glass substrate are held at 120° C. for two hours in a 10-liter airtight container.

According to this method, however, when a liquid is dropped on the liquid-repellent substrate, droplets each having a small contact angle with respect to the substrate are formed. Also, to form a layer containing electrically conductive ultra-fine particles in sufficient grain density, it is necessary to closely dispose a large number of droplets. Accordingly, the large number of droplets are connected to form a large amount of solvent on the substrate, increasing the droplet width on the substrate. Thus, the wiring width tends to become larger than a set value.

Since the droplets are formed on the liquid-repellent substrate, the adhesion of the wiring layer (a layer containing electrically conductive ultra-fine particles) becomes disadvantageously low. Furthermore, this has the problem of taking much labor to make the substrate surface water repellent.

As a method for preventing the expansion of the wiring width, it has been proposed to provide a receptor layer on the substrate surface for absorbing the solvent, for example, refer to Japanese Unexamined Patent Application Publication No. 05-50741. The method of absorbing the solvent by providing a porous membrane as the receptor layer is susceptible to improvement in the adhesion of the wiring layer.

Japanese Unexamined Patent Application Publication No. 2002-324966 describes a method for drawing a circuit pattern on a wiring substrate with electrically conductive metal paste by an inkjet system.

It, however, is also difficult to form a wire having a thin width with high adhesion to the substrate using this method.

SUMMARY OF THE INVENTION

As described above, the challenge to the method for forming a wiring pattern by an inkjet system is to form a wire having a fine line width with high adhesion to the substrate.

The present invention has been made to achieve the above object. Accordingly, in a method of forming a pattern by an inkjet system including the step of dropping a liquid that contains particles dispersed in a solvent by an inkjet system to dispose droplets made of the liquid in a specified pattern on a substrate and the step of vaporizing the solvent from the droplets to form a particle layer in the specified pattern on the substrate, it is an object of the present invention to provide a method for forming the specified pattern layer having a fine line width with high adhesion to the substrate.

In order to achieve the above object, the invention provides a method for forming a pattern by a droplet discharge system, including the following steps: preparing a substrate at least one surface of which is an adhesive face having specified adhesion; disposing droplets of a liquid containing particles dispersed in a solvent in a specified pattern on the adhesive face of the substrate by a droplet discharge system; and vaporizing the solvent from the droplets to form a particle layer in the specified pattern on the substrate. The method is hereinafter referred to as a first method of the invention.

Here, "having a specified adhesion" means that the force required for peeling-off by, for example, an adhesion test based on "JIS C2338" is 3.5 N or more per 19 mm.

The invention also provides a method for forming a pattern by a droplet discharge system, including the following steps: preparing a substrate at least one surface of which is an adhesive face having any one of acryl-based, silicone-based, rubber-based, petrolatum-based, vinyl-ether-based, and hot-melt-based adhesives; disposing droplets of a liquid containing particles dispersed in a solvent in a specified pattern on the adhesive face of the substrate by a droplet discharge system; and vaporizing the solvent from the droplets to form a particle layer in the specified pattern on the substrate. The method is hereinafter referred to as a second method of the invention.

The invention also provides a method for forming a pattern by a droplet discharge system, including the following steps: preparing a substrate; coating a liquid containing a resin having a property cured by the application of thermal energy or ultraviolet rays on at least one surface of the substrate; increasing the viscosity of the liquid to make the surface into an adhesive face having specified adhesion; disposing droplets of a liquid containing particles dispersed in a solvent in a specified pattern on the adhesive face of the substrate by a droplet discharge system; and vaporizing the solvent from the droplets to form a particle layer in the specified pattern on the substrate. The method is hereinafter referred to as a third method of the invention.

According to the first to third methods of the invention, the particle layer in the specified pattern can be formed in a fine line and with high adhesion to the substrate.

An example of the first to third methods of the invention is a method in which the particles are electrically conductive ultra-fine particles and the wiring pattern is formed by a droplet discharge system. The method corresponds to a wiring-pattern forming method by a droplet discharge system. According to this method, a wire with a fine line width can be formed with high adhesion to the substrate.

The invention also provides a method for forming a multilayer wiring structure, including the following processes (A) to (D):

(A) a first substrate forming process including the following steps: preparing a substrate at least one surface of which is an adhesive face having specified adhesion; disposing droplets of a liquid containing electrically conductive ultra-fine particles dispersed in a solvent in a specified pattern on the adhesive face of the substrate by a droplet discharge system; and vaporizing the solvent from the droplets to form a wiring pattern formed of the particle layer on the substrate;

(B) a second substrate forming process including the following steps: preparing a substrate at least one surface of which is an adhesive face having specified adhesion; forming a specified through hole in the substrate; disposing droplets of a liquid containing electrically conductive ultra-fine particles dispersed in a solvent on the adhesive face of the substrate in the region including the through hole in a specified pattern by a droplet discharge system; and vaporizing the solvent from the droplets to form a wiring pattern formed of the particle layer on the substrate;

(C) a process of stacking the first substrate and the second substrate with an adhesive such that the surface of the first substrate having the wiring pattern and the surface of the second substrate having no wiring pattern face each other and the through hole and the wiring pattern on the first substrate are overlapped with each other; and (D) a process of filling the through hole with an electrically conductive material to connect the wiring pattern on the first substrate with the wiring pattern on the second substrate.

In the method for forming a multilayer wiring structure according to the invention, the adhesive face can be formed of an adhesive layer made of any of acryl-based, silicone-based, rubber-based, petrolatum-based, vinyl-ether-based, and hot-melt-based adhesives.

In the method for forming a multilayer wiring structure according to the invention, the process of filling the through hole with an electrically conductive material is performed such that after the droplets of a liquid containing electrically conductive ultra-fine particles dispersed in a solvent have been dropped by a droplet discharge system, the solvent is vaporized from the droplets.

In the method for forming a multilayer wiring structure according to the invention, in the process of filling the through hole with an electrically conductive material, the electrically conductive material is formed at least on the side wall of the through hole to thereby connect the wiring pattern on the first substrate and the wiring pattern on the second substrate with each other.

In the method for forming a multilayer wiring structure according to the invention, the wiring pattern is formed by a pattern forming method by a droplet discharge system of the invention, thus facilitating formation of the multilayer wiring structure.

A first example of the present invention will be described with reference to FIGS. 1A–1C.

A polyimide adhesive tape No. 360A manufactured by Nitto Denko Corporation was prepared as substrate. The adhesive tape has an adhesive layer made of an acryl-based adhesive on a polyimide base material. The base material of the adhesive tape is 25 µm in thickness and the adhesive layer is 20 µm in thickness. The peeling adhesion based on a "JIS C2338" testing method is 3.5 N per 19 mm.

As a liquid containing particles dispersed in a solvent, "Perfect Silver" manufactured by Vacuum Metallurgical Co., Ltd. was prepared. The liquid is a dispersion liquid containing silver particles of 0.01 µm in particle diameter dispersed in toluene and has a viscosity of approximately 10 mPa/s.

Figure 1A:
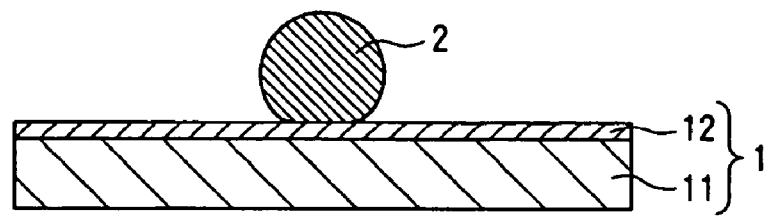
FIGS. 1A–1C show explanatory diagrams of a first example of the present invention.
Figure 1B:
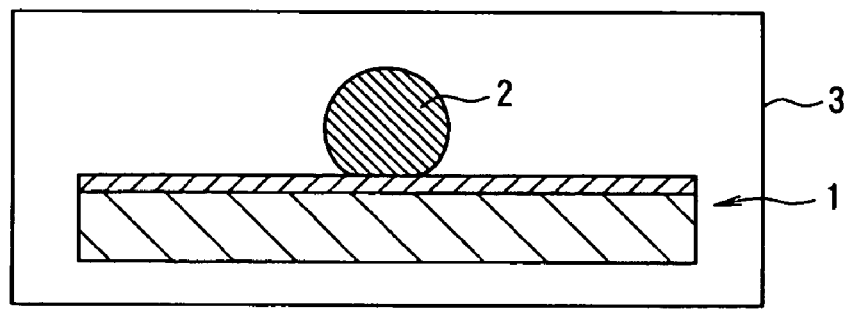
Figure 1C:
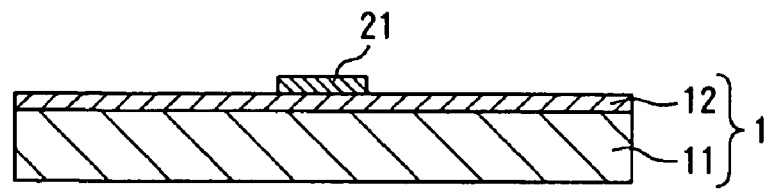

Referring to FIG. 1A, an adhesive tape (substrate) 1 formed of a base material 11 and an adhesive layer 12 was first disposed on an X-Y stage with an adhesive layer 12 facing up. Then, the liquid was dropped from inkjet nozzles toward the adhesive layer 12 while the adhesive tape 1 was being moved on the X-Y stage; thus, droplets 2 made of the liquid were disposed in a specified wiring pattern on the adhesive layer 12.

An inkjet unit "MJ-10000" manufactured by Seiko Epson Corporation was used as an inkjet unit. An inkjet head including 180 nozzles per row was used, only one row of which was used to form continuous droplets along the length of the wire. Briefly, one droplet was formed along the width of the wire. The conditions of dropping the liquid from the nozzles were set such that the distance between the substrate surface and the nozzles was 0.3 mm and the discharge amount at one time was 10 ng so that the diameter of the dropped droplet was 25 to 30 µm and the droplets was dropped at 20-µm spacing (the distance between the centers of the droplets) along the length of the wire.

Referring to FIG. B, the adhesive tape 1 in this state was held at 250° C. in a hot-air oven 3 for one hour to dry the disperse medium from the droplets 2.

Thus, as shown in FIG. C, a wiring layer 21 formed of silver particles contained in the droplets 2 was formed on the adhesive layer 12 of the adhesive tape 1. The wiring layer 21 was 28 μm in width. The wiring layer 21 had a volume resistivity of 4 μΩ/cm, approximately three times as high as that (1.6 μΩ/cm) of bulk silver.

When the adhesion of the obtained wiring layer 21 to the adhesive tape 1 was examined by a tape adhesion test based on "JIS K5400" (where, cross cut was omitted), the wiring layer 21 was not peeled off.

Accordingly, by the method of this example, a wire having a line width of 28 μm could be formed with high adhesion to the substrate.

Referring to FIGS. 2A–2D, a second example of the invention will now be described.

A glass substrate was prepared as a substrate. As a liquid containing a resin that has been cured by the application of ultraviolet rays, a polyimide-based coating liquid "Pimel" manufactured by Asahi Kasei Corporation was prepared. The coating liquid was a solution containing a photosensitive polyimide resin dissolved in N-methyl-2-pyrrolidone, having a viscosity of approximately 8 mPa/s.

As a liquid containing particles dispersed in a solvent, "Perfect Silver" manufactured by Vacuum Metallurgical Co., Ltd. was prepared. The liquid is a dispersion liquid containing silver particles of 0.01 μm in particle diameter dispersed in toluene and has a viscosity of approximately 10 mPa/s.

Figure 2A:
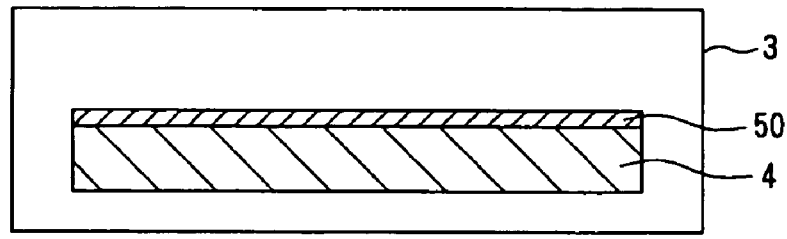
FIGS. 2A–2D show explanatory diagrams of a second example of the invention.

Referring to FIG. 2A, first, the coating liquid was applied to a glass substrate to form a layer 50 made of a photosensitive polyimide resin solution on a glass substrate 4. The glass substrate 4 in this state was held at 80° C. in a hot-air oven 3 for ten minutes, thereby removing the solvent from the layer 50 made of photosensitive polyimide resin solution.

Figure 2B:
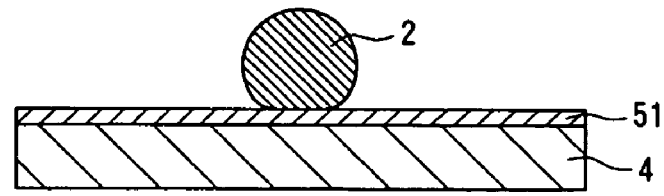

As a result, a layer 51 made of an uncured photosensitive polyimide resin was formed on the glass substrate 4, as shown in FIG. 2B. Thus, one face of the glass substrate 4 was made into an adhesive face having an adhesion of 3.5 N or more per 19 mm in a tape adhesion test based on "JIS C2338."

Referring now to FIG. B, the glass substrate 4 was disposed on an X-Y stage with the uncured resin layer 51 facing up. The liquid was dropped from inkjet nozzles toward the uncured resin layer 51 while the glass substrate 1 was being moved on the X-Y stage, thereby disposing the droplets 2 made of the liquid in a specified wiring pattern on the uncured resin layer 51 of the glass substrate 4.

An inkjet unit "MJ-10000" manufactured by Seiko Epson Corporation was used as an inkjet unit. An inkjet head including 180 nozzles per row was used, only one row of which was used to form continuous droplets along the length of the wire. Briefly, one droplet was formed along the width of the wire. The conditions of dropping the liquid from the nozzles were set such that the distance between the substrate surface and the nozzle was 0.3 mm and the discharge amount at one time was 10ng so that the diameter of the dropped droplet was 25 to 30 μm and the droplets was dropped at 20-μm spacing (the distance between the centers of the droplets) along the length of the wire.

Figure 2C:
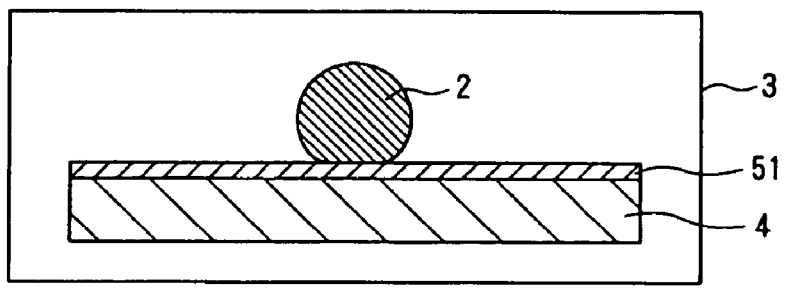
Figure 2D:
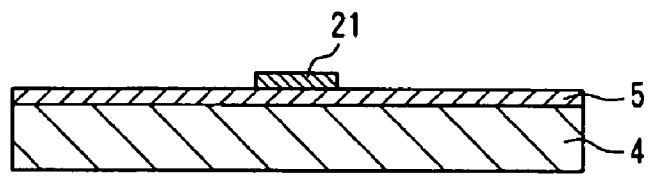

Referring now to FIG. 2C, the glass substrate 4 in this state was held at 350° C. in the hot-air oven 3 for two hours to dry the disperse medium from the droplets 2, thereby forming the wiring layer 21 and to cure the uncured resin layer 51, thereby forming a polyimide resin layer 5.

Thus, as shown in FIG. D, the wiring layer 21 formed of silver particles contained in the droplets 2 was formed on the polyimide resin layer 5 of the glass substrate 4. The wiring layer 21 was 28 μm in width. The wiring layer 21 had a volume resistivity of 4 μΩ/cm, approximately three times as high as that (1.6 μΩ/cm) of bulk silver.

When the adhesion of the obtained wiring layer 21 to the adhesive tape 1 was examined by the tape adhesion test based on "JIS K5400" (where, cross cut was omitted), the wiring layer 21 was not peeled off.

Accordingly, by the method of this example, a wire having a line width of 28 μm could be formed with high adhesion to the substrate.

Referring now to FIGS. 3 to 11, a third example of the invention will be described.

Figure 3:
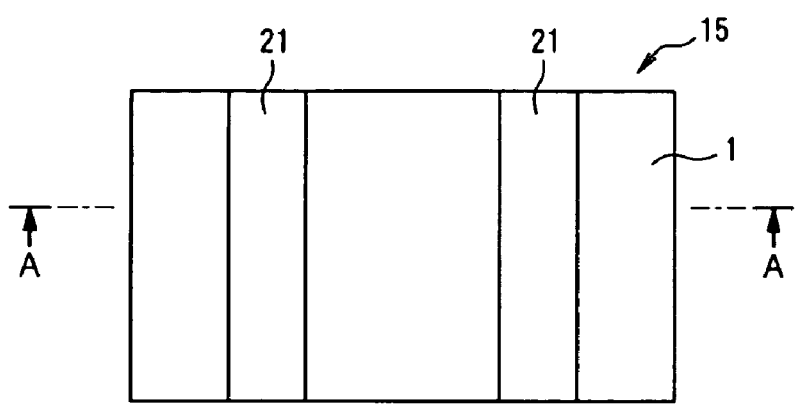
FIG. 3 is a plan view of the state of one process according to a third example of the invention.
Figure 4:
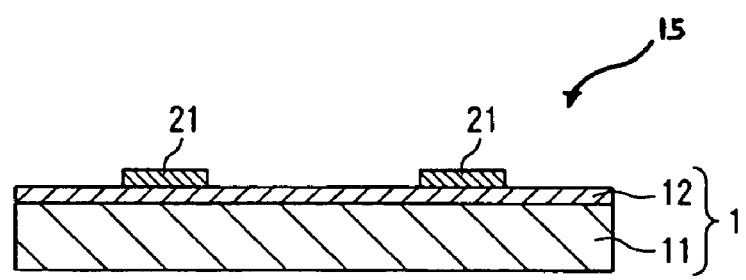
FIG. 4 is a sectional view taken along line A—A of FIG. 3.

The wiring layer 21 having the pattern shown in FIG. 3 was formed on the adhesive tape 1 by the method of the first example. That is referred to as a first wiring board 15. FIG. 4 shows a sectional view taken along line A—A of FIG. 3.

Figure 5:
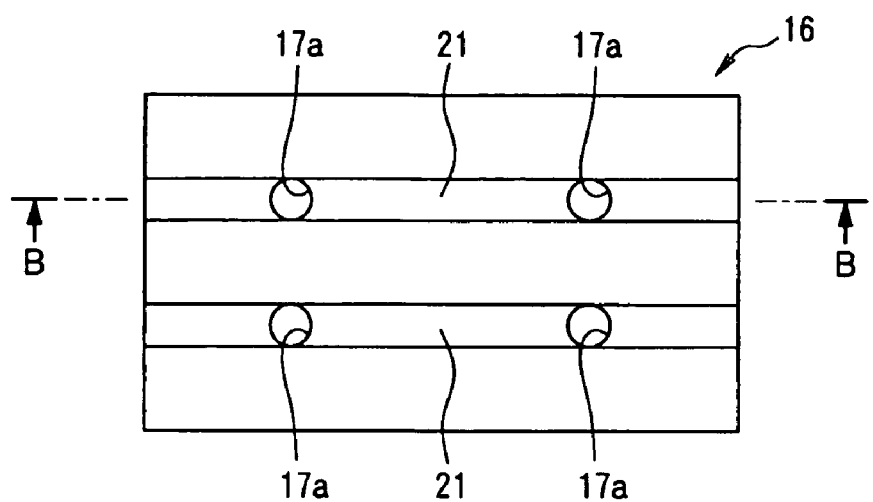
FIG. 5 is a plan view of the state of one process according to the third example of the invention.
Figure 6:
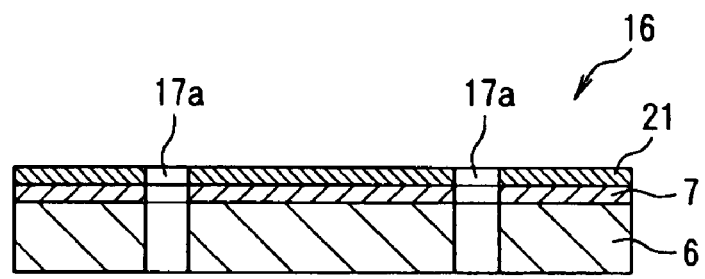
FIG. 6 is a sectional view taken along line B—B of FIG. 5.
Figure 7:
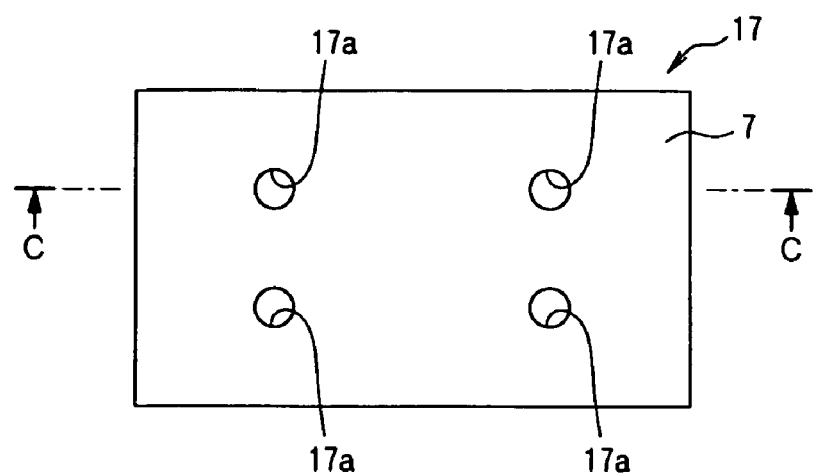
FIG. 7 is a plan view of the state of one process according to the third example of the invention.
Figure 8:
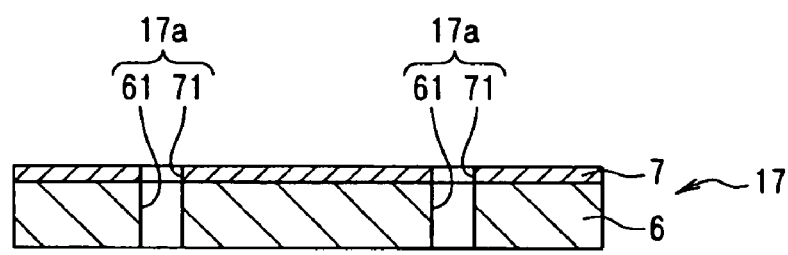
FIG. 8 is a sectional view taken along line C—C of FIG. 7.

A second wiring board 16 shown in FIGS. 5 and 6 was separately formed. FIG. 6 is a sectional view taken along line B—B of FIG. 5. The second wiring board 16 is made of an adhesive tape 17 shown in FIGS. 7 and 8. FIG. 8 is a sectional view taken along line C—C of FIG. 7.

The adhesive tape 17 is made of a base material 6 and an adhesive layer 7. The adhesive tape 17 may be the adhesive tape 1 of the first example. Through holes 17a were formed in specified positions of the adhesive tape 17 (the positions corresponding to the wiring layer 21 of the first wiring board 15). The through holes 17a are each formed of a through hole 61 of the base material 6 and a thorough hole 71 of the adhesive layer 7, as shown in FIG. 8.

Referring to FIGS. 5 and 6, the wiring layer 21 was formed on the adhesive layer 7 of the adhesive tape 17 as in the first example. The through holes 17a may be formed after the wiring layer 21 has been formed on the adhesive layer 7.

Figure 9:
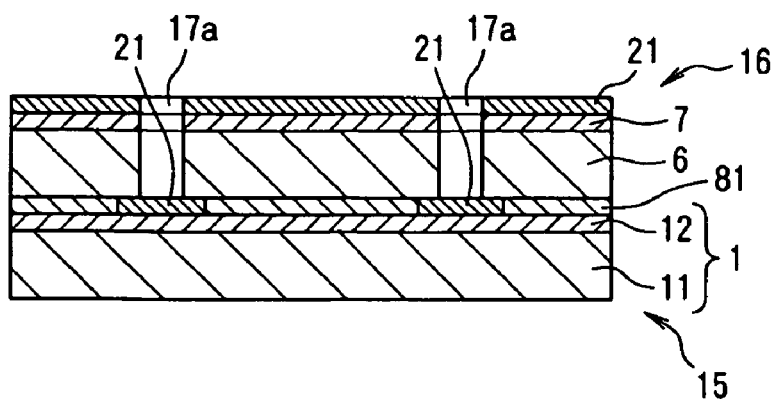
FIG. 9 is a sectional view of the state of one process according to the third example of the invention.

Referring now to FIG. 9, the second wiring board 16 was placed on the first wiring board 15 with an adhesive 81 therebetween. At that time, the positions of the through holes 17a of the second wiring board 16 and the wiring layer 21 of the first wiring board 15 were aligned with each other.

Figure 10:
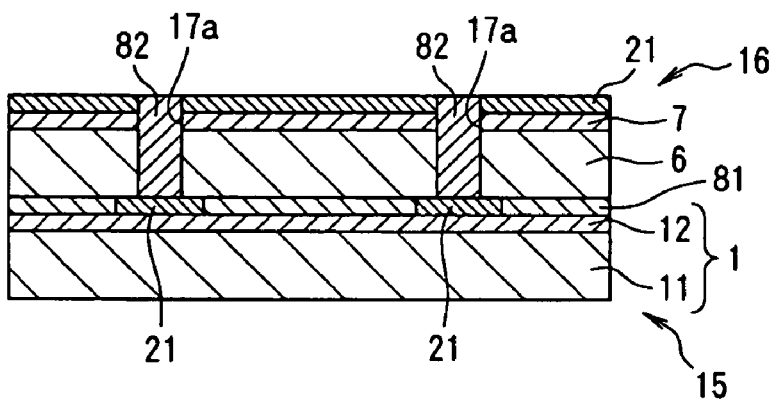
FIG. 10 is a sectional view taken along line D—D of FIG. 11.
Figure 11:
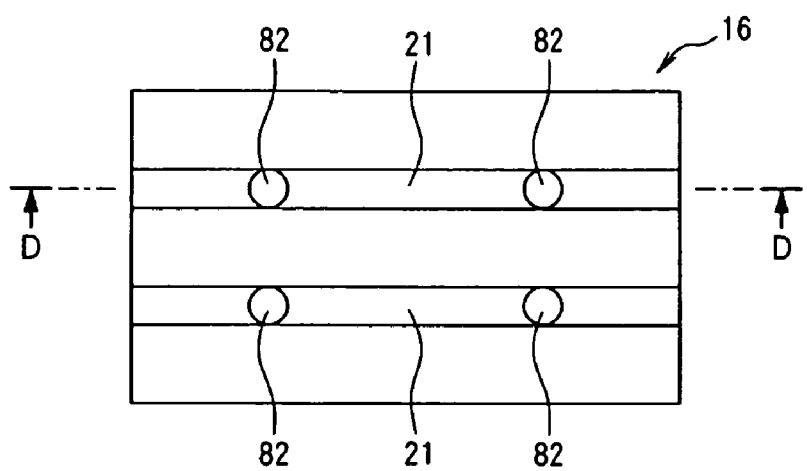
FIG. 11 is a plan view of the state of one process according to the third example of the invention.

Referring now to FIG. 10, a metal (electrically conductive material) 82 was put into the through holes 17a of the second wiring board 16 to connect the wiring layer 21 of the second wiring board 16 and the wiring layer 21 of the first wiring board 15 with each other. FIG. 11 shows that state in plan view, which corresponds to the sectional view taken along ling D—D of FIG. 11.

The injection of the metal 82 can be made such that the liquid containing electrically conductive ultra-fine particles dispersed in a solvent is dropped by an inkjet system and the solvent is then dried. In this case, it is sufficient for the layer made of the electrically conductive ultra-fine particles to be formed at least on the side wall of each through hole 17a so as to connect both the wiring layers 21 with each other.

According to the method of this example, a multilayer wiring structure can easily be formed by using the wiring-pattern forming method by an inkjet system of the invention.

The wiring layer 21 of the second wiring board 16 may be formed after the adhesive tape 17 in the state of FIG. 8 has been fixed to the first wiring board 15.

The process of injecting the metal (electrically conductive material) 82 into the through holes 17a may be performed before the second wiring board 16 is superposed on the first wiring board 15; however, it is preferable to perform the process after superposing because the metal 82 can be fixed to the wiring layer 21 without adhering process.

Figure 12:
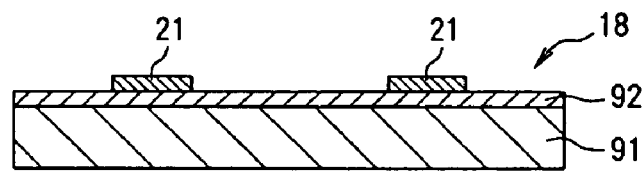
FIG. 12 is a sectional view of the state of one process according to another example of the invention.

Referring now to FIG. 12, the multilayer wiring structure may be formed using the adhesive tape 18 in which an adhesive layer 92 whose adhesion is decreased by the application of ultraviolet rays is formed on a base material 91. An example of the adhesive tape 18 is "EIEP holder" manufactured by Nitto Denko Corporation. In this case, the adhesion of the adhesive layer 92 is decreased by the application of ultraviolet rays with a wavelength of 365 nm at an illuminance of 300 mJ/cm$^2$ for one minute from the ultraviolet-permeability base material 91.

Figure 13:
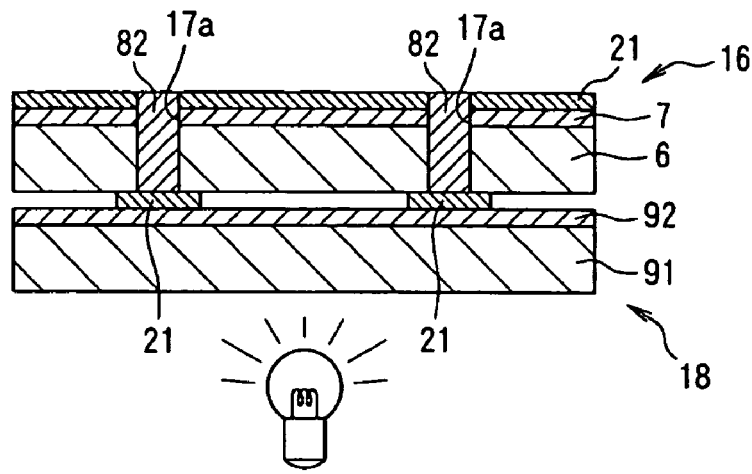
FIG. 13 is a sectional view of a process subsequent to FIG. 12.

In this case, as shown in FIG. 12, first, the wiring layer 21 is formed on the adhesive layer 92 of the adhesive tape 18, as in the first example. Next, as shown in FIG. 13, the second wiring board 16 in the state of FIG. 6 is placed thereon; the metal 82 is injected into the through holes 17a; then, ultraviolet rays are applied from the side adjacent to the base material 91 of the adhesive tape 18 under the above-described conditions. Accordingly, as shown in FIG. 14, the adhesion of the adhesive layer 92 is decreased, so that the wiring layer 21 comes off from the adhesive layer 92, and the wiring layer 21 is adhered to the back of the base material 6 of the second wiring board 16.

Figure 14:
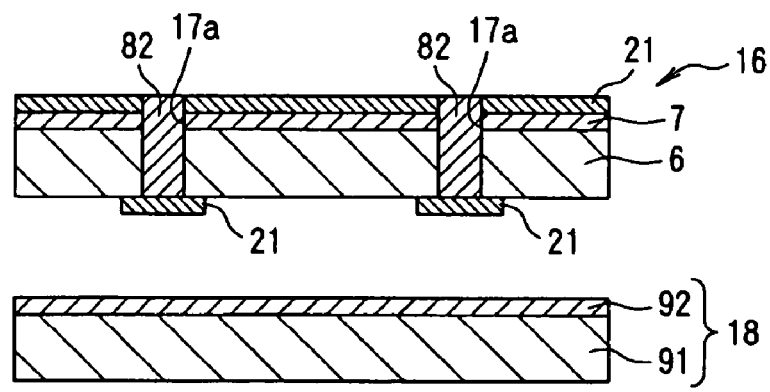
FIG. 14 is a sectional view of a process subsequent to FIG. 13.
Figure 15:
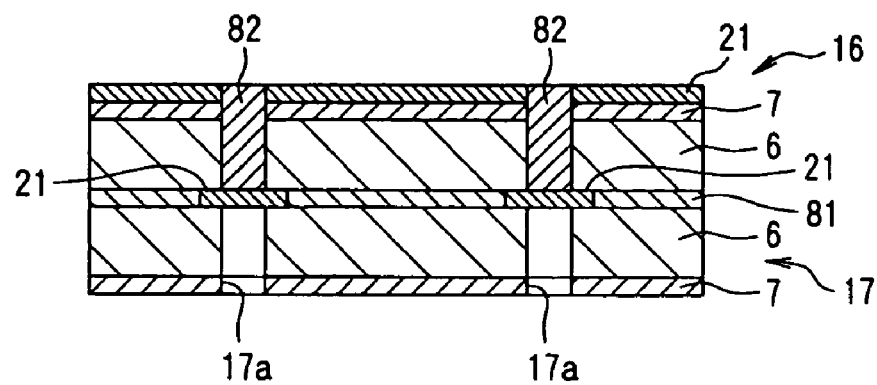
FIG. 15 is a sectional view of a process subsequent to FIG. 14.

Referring now to FIG. 15, the adhesive tape 17 in the state of FIG. 8 is placed with the base material 6 facing up, on which the second wiring board 16 of FIG. 14 having the wiring layer 21 adhered to the back thereof is placed. At that time, the positions of the wiring layer 21 under the second wiring board 16 and the through holes 17a of the adhesive tape 17 in the state of FIG. 8 are agreed with each other. The adhesive 81 is placed between both the base materials 6. FIG. 15 illustrates the state. The metal 82 is then injected into the through holes 17a of tape 17.

An adhesive tape having an adhesive layer whose adhesion is decreased by heat treatment on the base material may be used. An example of the adhesive tape is "Revalpha" manufactured by Nitto Denko Corporation. "Revalpha No. 3196" is decreased in adhesion at 90° C. for five minutes.

Although embodiments of the present invention have been described above, the present invention is not limited to the above-mentioned embodiments but applied to various kinds of modifications within the scope of the claims of the present invention. For example, in place of the adhesive tape having the adhesive layer only on one face of the base material, a substrate having the adhesive layer on both sides of the base material may be used. In this case, the wiring layer may be formed on both sides of the substrate.

What is claimed is:

1. A method for forming a multilayer wiring structure, comprising:
    preparing a first substrate at least one surface of which is a first adhesive face having specified adhesion that is decreased by application of a process, the process being selected from the group consisting of ultraviolet rays, heat treatment and combinations thereof;
    disposing droplets of a first liquid containing electrically conductive particles dispersed in a solvent on the first adhesive face;
    vaporizing the solvent from the droplets to form a first wiring pattern on the first adhesive face;
    preparing a second substrate at least one surface of which is a second adhesive face having specified adhesion;
    disposing droplets of a second liquid containing electrically conductive particles dispersed in a solvent on the second adhesive face;
    vaporizing the solvent from the droplets to form a second wiring pattern on the second adhesive face;
    stacking the first substrate and the second substrate such that the first adhesive face faces a first face of the second substrate opposite the second adhesive face and a through hole overlaps the first wiring pattern; and
    removing the first wiring pattern from the first substrate such that the first wiring pattern is transferred to the first face of the second substrate.

2. The method for forming a multilayer wiring structure according to claim 1, wherein the first adhesive face and the second adhesive face are formed of an adhesive layer made of acryl-based, silicone-based, rubber-based, petrolatum-based, vinyl-ether-based, and hot-melt-based adhesives.

3. The method for forming a multilayer wiring structure according to claim 1, wherein the vaporizing is performed using a hot-air oven.

4. The method for forming a multilayer wiring structure according to claim 1, wherein said adhesive face is formed by applying a coating liquid to said substrate and treating said coating liquid in a hot air oven.

5. The method of forming a multilayer wiring structure according to claim 1, wherein the removing of the first wiring pattern from the first substrate includes decreasing adhesion of the first adhesive face by a process, the process being selected from the group consisting of applying ultraviolet rays, heat treatment and combinations thereof.

6. The method of forming a multilayer wiring structure according to claim 1, further comprising filling the through hole with an electrically conductive material to connect the first wiring pattern with the second wiring pattern.

7. The method for forming a multilayer wiring structure according to claim 6, wherein the filling of the through hole with the electrically conductive material is performed such that after the droplets of a third liquid containing electrically conductive particles dispersed in a solvent have been dropped, the solvent is vaporized from the droplets.

8. The method for forming a multilayer wiring structure according to claim 6, wherein, the filling of the through hole with the electrically conductive material, the electrically conductive material is formed at least on the side wall of the through hole to thereby connect the first wiring pattern and the second wiring pattern with each other.

9. The method of forming a multilayer wiring structure according to claim 1, wherein the first adhesive face is formed by applying a coating liquid to the first base substrate and treating said coating liquid in a hot-air oven.

10. A method for forming a multilayer wiring structure, comprising:
    preparing a first substrate at least one surface of which is a first adhesive face having specified adhesion that is decreased by application of a process, the process being selected from the group consisting of ultraviolet rays, heat treatment and combinations thereof;
    disposing droplets of a first liquid containing electrically conductive particles dispersed in a solvent on the first adhesive face;
    vaporizing the solvent from the droplets to form a first wiring pattern on the first adhesive face;
    preparing a second substrate at least one surface of which is a second adhesive face having specified adhesion;
    forming a first through hole in the second substrate;
    disposing droplets of a second liquid containing electrically conductive particles dispersed in a solvent on the second adhesive face in a region including the first through hole;
    vaporizing the solvent from the droplets to form a second wiring pattern on the second adhesive face;

preparing a third substrate at least one surface of which is a third adhesive face having specified adhesion;

forming a second through hole in the third substrate;

stacking the first substrate and the second substrate such that the first adhesive face faces a first face of the second substrate opposite the second adhesive and the first through hole overlaps the first wiring pattern;

filling the first through hole with a first electrically conductive material to connect the first wiring pattern with the second wiring pattern;

removing the first wiring pattern from the first substrate such that the first wiring pattern is transferred to the first face of the second substrate by applying a process, the process being selected from the group consisting of applying ultraviolet rays to the first adhesive face, heating the first adhesive face and combinations thereof;

stacking the second substrate and the third substrate such that the second through hole overlaps the first wiring pattern that has been transferred to the first face of the second substrate; and filling the second through hole with a second electrically conductive material to connect the second electrically conductive material with the first wiring pattern.

11. The method of forming a multilayer wiring structure according to claim 10, wherein the stacking of the second substrate and the third substrate includes facing the first face of the second substrate and a second face of the third substrate opposite the third adhesive face.

12. The method of forming a multilayer wiring structure according to claim 10, wherein the first adhesive face and the second adhesive face are formed of an adhesive layer made of any of acryl-based, silicone-based, rubber-based, petrolatum-based, vinyl-ether-based, and hot-melt-based adhesives.

13. The method of forming a multilayer wiring structure according to claim 10, wherein the vaporizing is performed using a hot-air oven.

* * * * *